(12) United States Patent
Zakel et al.

(10) Patent No.: US 7,882,997 B2
(45) Date of Patent: Feb. 8, 2011

(54) METHOD AND DEVICE FOR MUTUAL CONTACTING OF TWO WAFERS

(75) Inventors: Elke Zakel, Falkensee (DE); Ghassem Azdasht, Berlin (DE)

(73) Assignee: Pac Tech-Packaging Technologies GmbH, Nauen (DE)

( * ) Notice: Subject to any disclaimer, the term of this patent is extended or adjusted under 35 U.S.C. 154(b) by 781 days.

(21) Appl. No.: 11/572,105

(22) PCT Filed: Jul. 11, 2005

(86) PCT No.: PCT/DE2005/001230

§ 371 (c)(1),
(2), (4) Date: Oct. 19, 2007

(87) PCT Pub. No.: WO2006/005327

PCT Pub. Date: Jan. 19, 2006

(65) Prior Publication Data

US 2008/0171404 A1 Jul. 17, 2008

(30) Foreign Application Priority Data

Jul. 15, 2004 (DE) ......... 10 2004 034 421

(51) Int. Cl.
*B23K 37/04* (2006.01)
(52) U.S. Cl. .......... 228/5.5; 228/6.2; 228/44.7; 228/49.5
(58) Field of Classification Search ............ None
See application file for complete search history.

(56) References Cited

U.S. PATENT DOCUMENTS

| | | | | |
|---|---|---|---|---|
| 4,018,373 A * | 4/1977 | Beerwerth et al. | ......... | 228/44.7 |
| 4,752,180 A | 6/1988 | Yoshikawa | | |
| 5,058,796 A * | 10/1991 | Schwarzbauer | ............ | 228/44.3 |
| 5,067,647 A * | 11/1991 | Schwarzbauer | ............. | 228/5.5 |
| 5,632,434 A * | 5/1997 | Evans et al. | ................. | 228/44.7 |
| 6,257,478 B1 * | 7/2001 | Straub | ......... | 228/6.2 |
| 7,581,669 B2 * | 9/2009 | Lee | ............. | 228/193 |
| 2002/0100791 A1 * | 8/2002 | Mukuno et al. | ............ | 228/49.5 |
| 2002/0187589 A1 * | 12/2002 | Tsujimoto | .................... | 438/118 |
| 2003/0148596 A1 | 8/2003 | Kellar et al. | | |
| 2003/0178468 A1 * | 9/2003 | Lee et al. | ..................... | 228/102 |
| 2003/0211704 A1 | 11/2003 | Shaheen et al. | | |

(Continued)

FOREIGN PATENT DOCUMENTS

AT 405 700 10/1999

(Continued)

*Primary Examiner*—Kiley Stoner
(74) *Attorney, Agent, or Firm*—McGlew and Tuttle, P.C.

(57) ABSTRACT

A method and a device for the mutual contacting of two wafer-type component composite configurations made of multiple identical components which are implemented coherently, in particular a semiconductor wafer (12) with a functional component wafer (14), to produce electronic assemblies on the wafer level, in which the component composite configurations are each situated on a receptacle unit (11; 13) and the contact pressure necessary for the contacting between contact metallizations of the component composite configurations to be connected to one another is generated in such a way that a vacuum is generated in a contact chamber which receives the component composite configurations and is delimited by the receptacle units, and the contacting of the contact metallizations is performed by a rear energy impingement of a component composite configuration.

20 Claims, 3 Drawing Sheets

U.S. PATENT DOCUMENTS

| | | | |
|---|---|---|---|
| 2004/0011225 A1* | 1/2004 | Kano et al. | 100/325 |
| 2004/0014298 A1 | 1/2004 | Ehrke et al. | |
| 2007/0284409 A1* | 12/2007 | Kobrinsky et al. | 228/44.7 |

FOREIGN PATENT DOCUMENTS

| | | |
|---|---|---|
| DE | 100 48 881 A1 | 3/2002 |
| DE | 102 00 538 B4 | 7/2003 |
| EP | 0 796 719 A1 | 9/1997 |
| JP | 02-123726 A | 5/1990 |
| JP | 2003-205510 A * | 7/2003 |
| JP | 2003-249620 | 9/2003 |
| JP | 2003-318229 A * | 11/2003 |
| JP | 2005-066910 A * | 3/2005 |
| JP | 2005-088267 A * | 4/2005 |
| WO | WO 2004/026531 A2 | 4/2004 |

* cited by examiner

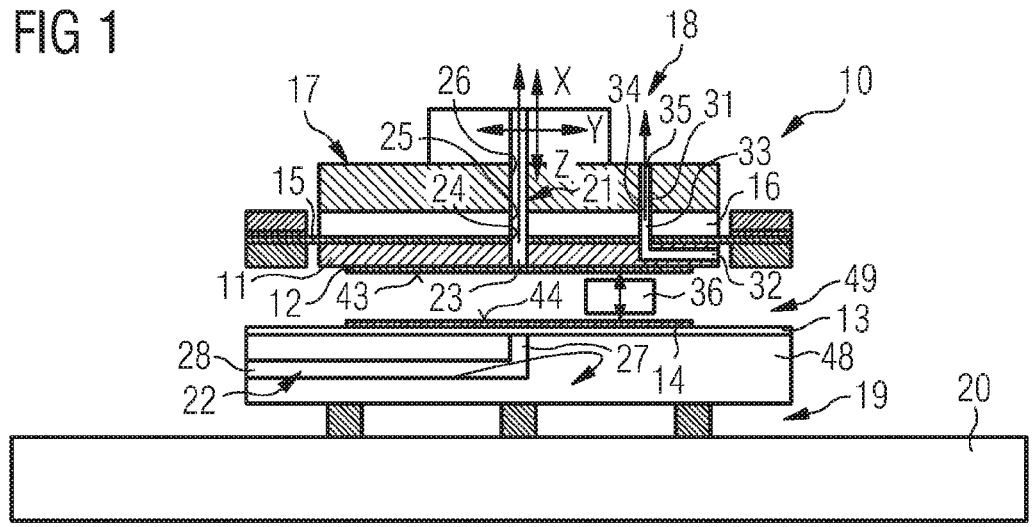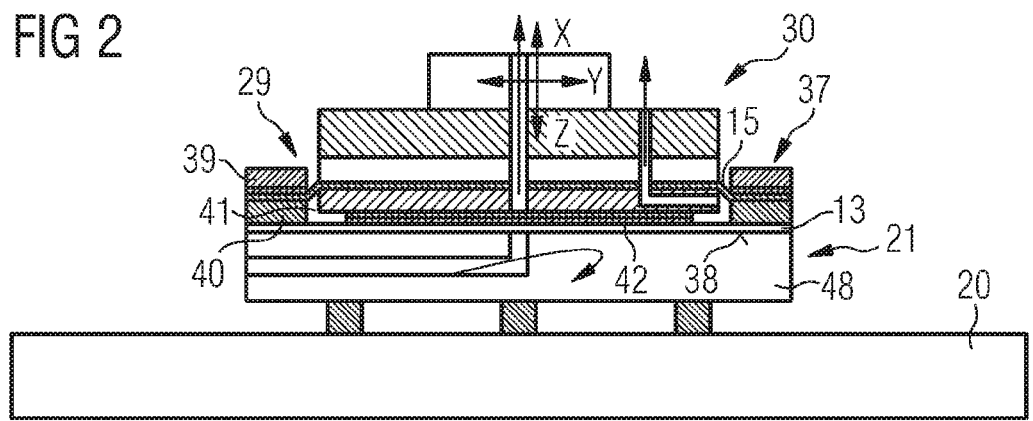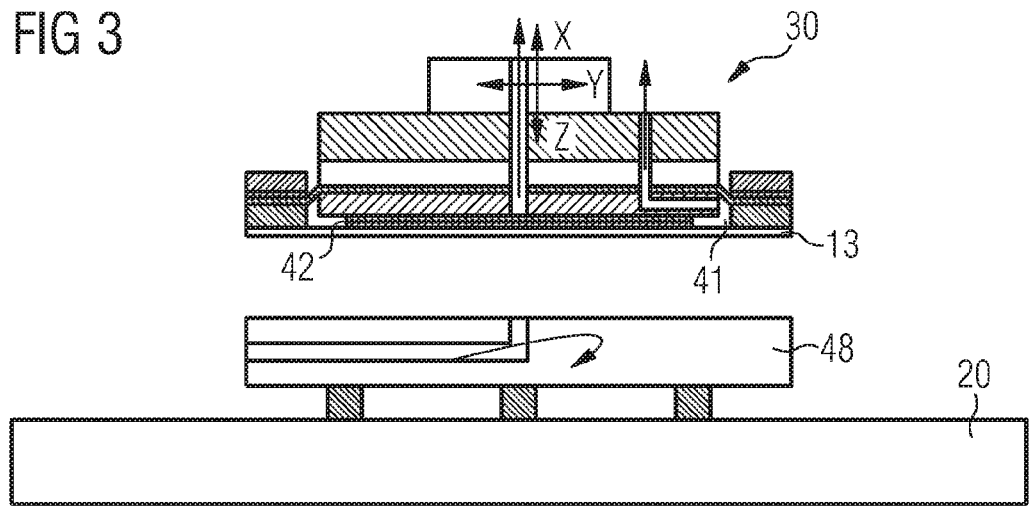

METHOD AND DEVICE FOR MUTUAL CONTACTING OF TWO WAFERS

CROSS-REFERENCE TO OTHER APPLICATIONS

This is a National Phase of International Application No. PCT/DE2005/001230, filed on Jul. 11, 2005, which claims priority from German Patent Application No. 10 2004 034 421.3, filed on Jul. 15, 2004.

BACKGROUND OF THE INVENTION

The present invention relates to a method for the mutual contacting of two wafer-type component composite configurations from multiple identical components which are implemented coherently, in particular a semiconductor wafer with a functional component wafer, to produce electronic assemblies on the wafer level, according to Claim 1. In addition, the present invention relates to a device according to Claim 7, which is especially suitable for performing the method.

The method and the device of the above-mentioned type are very generally used when substrates implemented coherently in a composite are to be connected with components also situated in a composite without prior dissolution of the particular composite.

To produce electronic assemblies on the chip level, for example, chips which are contacted with functional components activated via the chips, such as laser diodes, it is known to produce both the chip and also the laser diode on the wafer level, i.e., in a coherent wafer composite, and subsequently to isolate both the chips and also the laser diodes from the particular wafer composite before contacting the chips with the laser diodes. The necessity results therefrom of performing a positioning and connection procedure necessary for contacting the chips with the laser diodes separately and repeatedly in accordance with the number of chips and/or laser diodes.

The advantages of being able to perform contacting of this type on the wafer level in order to perform the required positioning and connection procedure only once for multiple laser diodes or chips situated in the composite are obvious. Because of the relatively large-area distribution of the individual contact metallizations of chips and laser diodes to be connected to one another, it has proven difficult, however, to set a uniform gap dimension over the entire wafer surface. The result thereof may be faulty contacts between individual pairs of contact metallizations.

SUMMARY OF THE INVENTION

It is the object of the present invention to suggest a method and a device for producing electronic assemblies on the wafer level which allows the implementation of a uniform gap dimension between the wafers to be contacted.

To achieve this object, the method according to the present invention has the features of Claim 1 and the device according to the present invention has the features of Claim 7.

In the method according to the present invention, the contact pressure between the contact metallizations to be connected to one another which is required for the contacting is generated by implementing a vacuum in the contact chamber receiving the component composite configurations. The subsequent contacting of the contact metallizations occurs through a rear energy impingement of a component composite configuration.

Implementing the vacuum in the contact chamber ensures a coplanar configuration of the component composite configurations, without the specific bending behavior of the wafers and/or of devices on which the wafers are situated having to be taken into consideration in comparison with a pressure impingement for generating the required contact pressure.

In particular, it is not necessary to take measures to compensate for the bending behavior and/or a deviation of the bending line from a straight line in the wafers, as would be the case in the event of a pressure impingement of the wafers.

Furthermore, arbitrarily high contact pressures between the wafers, which are solely limited by the component strength, may be set via the setting of the vacuum, without an additional outlay for apparatus in terms of mechanical or hydraulic contact pressure devices being necessary.

The method according to the present invention may be used especially advantageously for producing "SAW (surface acoustic wave) filters" on the wafer level. In these assemblies, to achieve a vacuum-tight connection with carrier chips, cover chips are connected to the carrier chips via a hermetically-sealed peripheral contact metallization in addition to the electrical contacts.

In an especially advantageous variation of the method, the contact chamber is generated by producing a vacuum-tight connection between the receptacle units which receive the component composite configurations having their contact metallizations diametrically opposite one another. It is thus possible to implement the contact chamber using the lowest possible number of components, only a seal unit being added to the receptacle units provided in any case.

Energy impingement of the friction-locked composite of the component composite configurations implemented by the vacuum impingement in the contact chamber prior to the thermal contact, i.e., to implement the bond connection, is made possible in an especially simple method by an energy impingement of the composite via a receptacle unit. In this way, the outlay for apparatus required for performing the method may especially be reduced, since a furnace unit, into which the composite situated in the contact chamber would be introduced, may be dispensed with.

An especially simple type of energy impingement may be performed by performing the energy impingement by implementing the receptacle unit as a heating unit.

Alternatively, it is possible to perform the energy impingement by a contact heating of the receptacle unit, so that the receptacle unit is solely used for introducing heat into the composite of the component composite configurations provided in the contact chamber.

In a further advantageous embodiment of the method, the energy impingement is performed by a radiation impingement of the receptacle unit. It is advantageously possible for this purpose to tailor the material of the receptacle unit and the type of the radiation source to one another so that, for example, if an absorbent material is selected for the receptacle unit, an infrared radiation source may be used, or if an optically transparent material is selected for the receptacle unit, a laser radiation source may be used.

The device according to the present invention has a first receptacle unit for receiving the first component composite configuration and a second receptacle unit for receiving the second component composite configuration, a seal unit for the sealed connection of the receptacle units to one another and for implementing a pressure-tight contact chamber which encloses the component composite configurations, an attachment unit for attaching a vacuum unit to the contact chamber, and an energy impingement unit for the rear energy impingement of at least one component composite configuration via a receptacle unit. Accordingly, in the device according to the present invention, the contact chamber required for generating a vacuum acting between the component composite configurations is made possible by the sealed connection of the receptacle units to one another.

It has been shown to be especially advantageous if the seal unit is implemented as elastic at least in a connection area between the receptacle units. This elasticity may be achieved both by a corresponding material selection for the seal unit and also by a dimensionally-elastic design of the seal unit. It is essential for this purpose that the seal unit allows the implementation of the vacuum-tight contact chamber, and, in addition, does not obstruct the implementation of the contact pressure between the contact metallizations of the component composite configurations, which are situated diametrically opposite one another.

According to an advantageous embodiment, the seal unit has a seal body having a seal surface formed by a rigid body unit. It is thus possible to implement the elasticity required for the function of the device and, in addition, to allow a design of the seal surface which has proven in operation to be as free from abrasion as possible.

If the rigid body unit comprises a sealing ring which peripherally encloses the first receptacle unit and is connected to this receptacle unit, whose sealing face presses flatly against the second receptacle unit, a secure seal may be implemented, and, in addition, a deviation in the parallelism between the receptacle units may easily be compensated for via the seal body.

An embodiment of the device having a seal body which does not impair the usable area of the receptacle unit for situating the component composite configuration is possible if the seal body is formed from a material web of an elastic, gas-tight material and is connected to the circumference of the receptacle unit.

A sealed connection between the seal body and the receptacle unit may be dispensed with if the seal body extends over the rear of the receptacle unit and thus encloses the rear of the receptacle unit.

If the receptacle unit is provided with a handling unit, with an elastic equalizing unit situated interposed, it is ensured that parallelism deviations between the handling unit and the receptacle unit do not have a disadvantageous effect on the contact pressure between the component composite configurations.

An especially compact embodiment of the device is possible if the second receptacle unit is implemented as a contact plate for contact heating using a contact heating unit to implement an energy impingement unit, since the device may thus be implemented independently of a heating unit and is solely to be brought into contact with a heating unit for the heat impingement of the component composite configuration.

Alternatively, it is possible to implement the second receptacle unit as a plate which is at least regionally radiation-transparent to implement an energy impingement unit.

An embodiment of the device which is compact overall, having a quasi-integrated heating unit, is made possible if the second receptacle unit is implemented as a contact heater to implement an energy impingement unit.

An embodiment of the receptacle unit as a contact heater which is especially simple to implement comprises an embodiment of the receptacle unit as a resistance heater.

If the receptacle unit implemented as a resistance heater is implemented as an electrical resistance film, an especially light weight and simultaneously rapidly acting heating possibility for the component composite configuration results.

BRIEF DESCRIPTION OF THE DRAWINGS

In the following, preferred variations of the method are described in greater detail with explanation of preferred embodiments of the devices used for this purpose on the basis of the drawing in which FIG. 1 shows a wafer bonding device for producing a contact composite between two wafers which are each situated on a receptacle unit, FIG. 2 shows the wafer bonding device having the wafer composite produced in a contact chamber;

FIG. 3 shows the wafer bonding device raised from a work platform while carrying along the wafer composite;

DETAILED DESCRIPTION OF THE INVENTION

Figure 4:
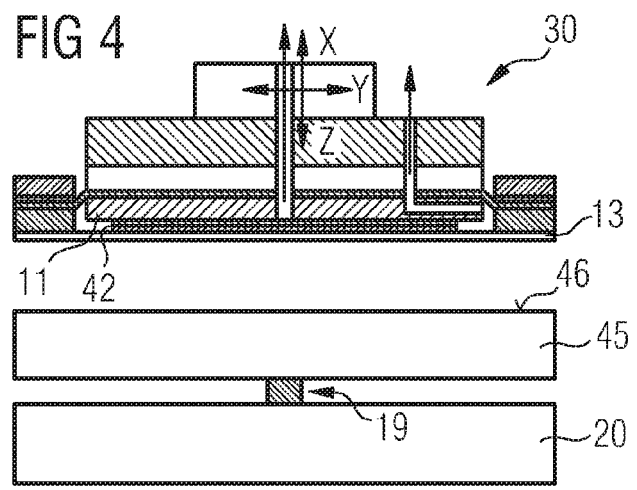
FIG. 4 shows the wafer bonding device having the wafer composite before the positioning on a contact heater.

FIG. 1 shows a wafer bonding device 10 having a first receptacle unit 11 for situating a first wafer 12 and a second receptacle unit 13 for situating a second wafer 14. In the present case the receptacle unit 11 comprises a metal plate and is connected to a handling unit 17 with a flat elastic seal body 15, formed here from a film web, of a seal unit 15 and an intermediate layer 16 having elastically springy properties being situated interposed. The handling unit 17 is provided with a control unit 18 acting in three axes, which allows spatial positioning of the wafer 12 situated on the receptacle unit 11 in relation to the wafer 14 situated on the receptacle unit 13.

As FIG. 1 also shows, the receptacle unit 13 is situated on a work platform 48, which is located in the present case on a base frame 20, with an elastic support unit 19 situated interposed.

As FIG. 1 also shows, both the receptacle unit 11 connected to the handling unit 17 and also the receptacle unit 13 situated on the work platform 48 are provided with an attachment unit 21 or 22, respectively, for attachment to a vacuum pump in each case (not shown in greater detail here). To implement the attachment unit 21, the receptacle unit 11 has a hole 23, which is situated aligned with a hole 24 in the seal body 15, a hole 25 in the intermediate layer 16, and a hole 26 in the handling unit 17. The receptacle unit 13 has a hole 27, which passes into a channel 28 implemented in the work platform 48. The external hole 26 in the handling unit 17 and the channel 28 in the work platform 48 are each provided for the attachment to the vacuum pumps (not shown).

The handling module made of the handling unit 17 and the receptacle unit 11 connected thereto with the seal unit 29 and the intermediate layer 16 situated interposed, which is shown in FIG. 1 above and at a distance to the receptacle unit 13 and the wafer 14 situated thereon, is to be identified in the following as a bonding head 30. The bonding head 30 has a further attachment unit 31 for attachment to a further vacuum pump (not shown in greater detail here), which allows the external attachment of the vacuum pump via a hole 32 in the receptacle unit 11, a hole 33 in the seal body 15, a hole 34 in the intermediate layer 16, and a hole 35 in the handling unit 17.

In a method for producing a bond connection between the two wafers 12, 14, FIG. 1 shows a phase directly before the mutual contacting of contact metallizations of the wafers 12, 14, which contact metallizations are not shown in greater detail here and are diametrically opposite one another on contact surfaces 43, 44. The phase illustrated in FIG. 1 is preceded by reception of the wafer 12 by the bonding head 30 by a vacuum impingement of the wafer 12 via the bonding head 30 positioned above the wafer 12 and positioning of the bonding head 30 above the wafer 14, which was previously positioned on the work platform 48 and is also fixed on the receptacle unit 13 using vacuum impingement.

In the phase illustrated in FIG. 1, a relative orientation of the bonding head 30 then occurs in relation to the work platform 48 in such a way that the contact metallizations of the wafers 12, 14 to be contacted with one another are brought into an overlapping position. For this purpose, the bonding head 30 is activated via the control unit 18 as a function of an image processing unit (not described in greater detail here), whose input signals originate from a camera unit 36 situated in a wafer intermediate chamber 48.

After setting the overlapping position between the contact metallizations of the wafers 12, 14 and removing the camera unit 36 from the wafer intermediate chamber 49, the bonding head 30 travels toward the work platform 48 until reaching a mechanical contact between the contact metallizations of the wafers 12 and 14 to be contacted with one another. Upon reaching the contact, a seal ring 37 of the seal unit 29, which is shown in FIG. 2 and is connected gas-tight to the seal body 15, has its circular sealing surface 38 pressed against the receptacle unit 13, which is formed by a steel plate in the exemplary embodiment illustrated here and is situated on the work platform 48. In the exemplary embodiment illustrated here, the seal ring 37 comprises two metal rings 39, 40, which receive the peripheral edge of the seal body 15 between them.

In the configuration illustrated in FIG. 2, a contact chamber 41 which is delimited by the receptacle units 11, 13 and is sealed by the seal unit 29 is formed by the contact of the seal ring 37 with the receptacle unit 13, which contact chamber receives a wafer composite 42 formed by the wafers 12 and 14 therein. After the contact chamber 41 illustrated in FIG. 2 is implemented, it may be evacuated via the attachment unit 31 which is implemented in the bonding head 30 and discharges via the receptacle unit 13 into the contact chamber 41.

By implementing the vacuum in the contact chamber 41, the wafers 12, 14 of the wafer composite 42 are pressed against one another, so that depending on the level of the vacuum set, the contact pressure required for the a subsequent thermal connection procedure between the contact metallizations may be set. If parallelism deviations exist between the surfaces of the receptacle units 11, 13, these are compensated for by the elastic intermediate layer 16 situated between the receptacle unit 11 and/or the seal body 15 of the seal unit 29 and the handling unit 17, so that in any case a coplanar configuration of the contact surfaces 43, 44 of the wafers 12, 14 and/or the implementation of a constant gap dimension over the contact surfaces between the wafers 12, 14 in the wafer composite 42 is ensured.

After setting the desired contact pressure between the wafers 12, 14 of the wafer composite 42 in the contact chamber 41, the vacuum applied to the rear of the wafer 14 via the attachment unit 22 implemented in the work platform 48 is turned off, so that, as shown in FIG. 3, the bonding head 30, together with the receptacle unit 13, may be lifted off the work platform 48 while maintaining the wafer composite 42 implemented in the contact chamber 41.

Figure 5:
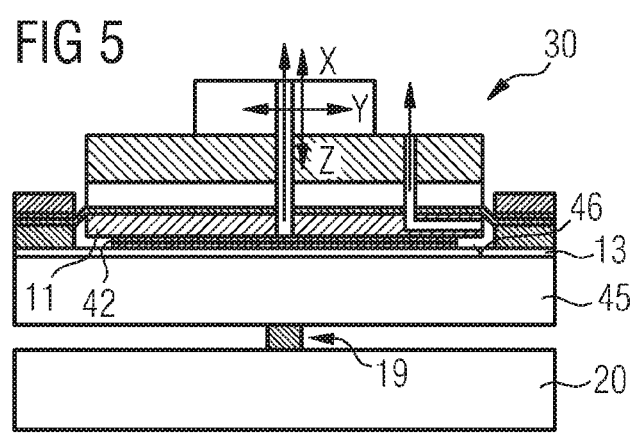
FIG. 5 shows the wafer bonding device positioned on the contact heater for performing the bond connection between contact metallizations of the wafer.

As shown in FIGS. 4 and 5, the bonding head 30 is subsequently positioned over a preheated contact heating unit 45 and lowered thereon, so that the receptacle unit 13 is lowered onto the contact heating unit 45 to allow a heat transfer. A heating procedure to the desired bonding temperature is now performed in accordance with the desired temperature profile, for the monitoring of which a temperature sensor (not shown in greater detail here) may be provided in the receptacle unit 11 of the bonding head 30. If maintaining the bonding temperature over a defined duration is intended, the configuration illustrated in FIG. 5 may also be provided with a distance regulation unit (not shown in greater detail here), which, after reaching the bonding temperature, allows the setting and/or changing of a distance between the receptacle unit 13 and a contact surface 46 of the contact heating unit 45 to maintain the bonding temperature over a specific duration.

As an alternative to the positioning of the bonding head 30 on the contact heating unit 45 explained above, it is also possible to implement the work platform 48 shown in FIG. 1 as heated and to perform the contact heating in the configuration illustrated in FIG. 1.

If targeted cooling is desired, cooling may subsequently be performed by positioning the bonding head 30 on a contact cooling unit (not shown in greater detail here).

In addition, it is also possible to cool the bonding head 30 using a coolant flow, in particular an air flow, conducted through the vacuum channel 26 or separate cooling channels.

To prevent a parallelism deviation between the contact surface 46 of the contact heating unit 45 and the receptacle unit 13 from having an effect on the wafer composite 42, as shown in FIGS. 4 and 5, an elastic support unit 19 may be provided between the base frame 20 and the contact heating unit 45, similarly as in the configuration shown in FIGS. 1 through 3.

During the bonding phase illustrated as an example in FIG. 5, in which thermal bonding between the contact metallizations of the wafers 12 and 14 occurs, it is also possible if necessary to elevate the contact pressure generated by the vacuum in the contact chamber 41 further by a pressure impingement of the wafer composite 42 using the bonding head. The vacuum fixing of the wafers 12 and 14 against one another prevents a sliding movement of the wafers 12, 14 on one another which would otherwise be possible due to the pressure impingement.

Figure 6:
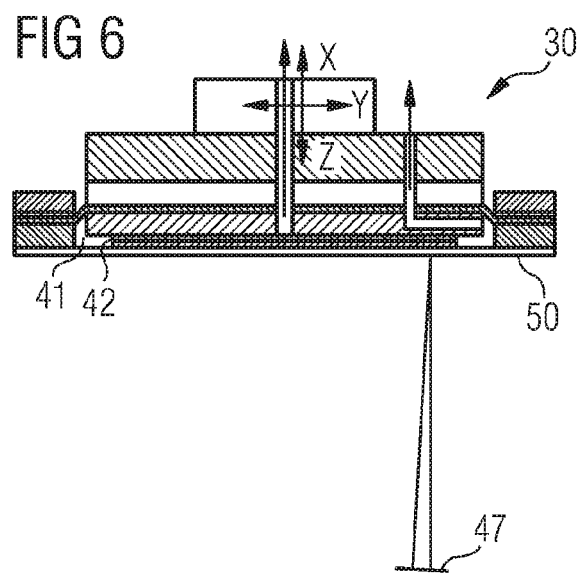
FIG. 6 shows a performance of the bond connection using laser impingement.
Figure 7:
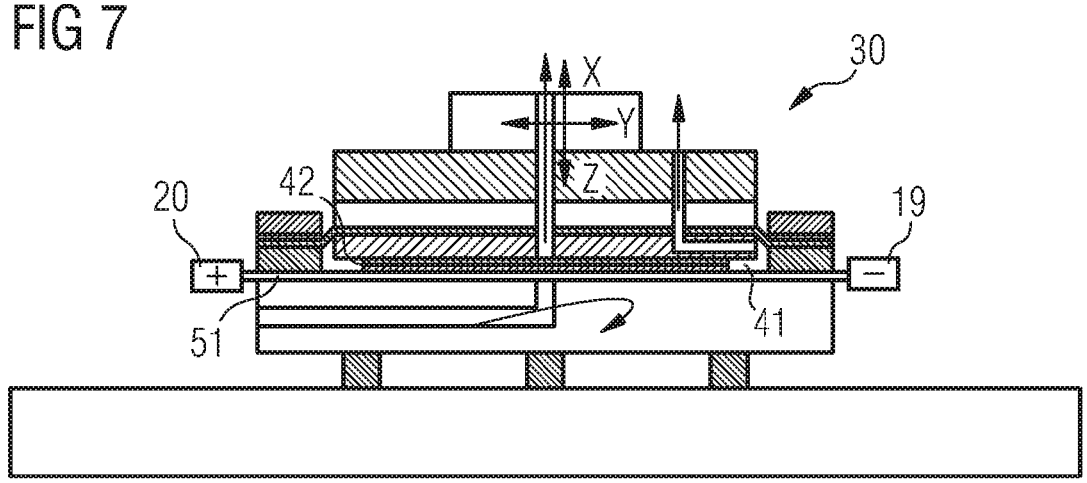
FIG. 7 shows a performance of the bond connection using a receptacle unit implemented as a resistance film.

Alternative possibilities for heating the wafer composite 42 situated in the contact chamber 41 on the bonding head 30 are illustrated in FIGS. 6 and 7. FIG. 6 shows heating using a selective energy impingement of the contact metallizations via a pivotable laser emission unit 47, a receptacle unit 50 made of a material transparent to the laser radiation being implemented for this purpose. If the receptacle unit is implemented from a material which absorbs radiation and/or heat, such as silicon, the wafer composite may be heated using heat conduction.

In a further embodiment of the bonding head (not shown in greater detail here), it may also be provided with an integrated laser emission unit, so that notwithstanding the exemplary embodiment illustrated in FIG. 6, the heating of the wafer composite is performed via the receptacle unit facing toward the bonding head.

FIG. 7 shows a receptacle unit 51 which is situated on the bonding head 30 and is implemented as an electrically heatable resistance film. A receptacle unit directly heatable in this way allows the production of the thermal bond connection between the contact metallizations of the wafers 12, 14 of the wafer composite 42 on the bonding head 30 itself, without a separate heating unit having to be provided.

What is claimed:

1. A device for the mutual contacting of two wafer-type component composite configurations made of multiple identical components which are implemented coherently, the device comprising:
   a first receptacle unit receiving a first component composite configuration and a second receptacle unit receiving a second component composite configuration;
   a seal unit for a sealed connection of the receptacle units to one another and for implementing a pressure-tight contact chamber which encloses the component composite configurations, wherein said seal unit surrounds said first component composite configuration and said second component composite configuration to form said pressure-tight contact chamber;
   an attachment unit for attaching a vacuum unit to the contact chamber; and
   an energy impingement unit for a rear energy impingement of a component composite configuration via the second receptacle unit.

2. The device according to claim 1, wherein said seal unit is elastic at least in a connection area between said first receptacle unit and said second receptacle unit.

3. The device according to claim 2, wherein said seal unit has an elastic seal body having a seal face formed by a rigid body unit.

4. The device according to claim 3, wherein said rigid body unit comprises a seal ring, which peripherally encloses said first receptacle unit and is connected to said first receptacle unit via said seal body, whose seal surface presses flatly against said second receptacle unit.

5. The device according to claim 3, wherein said seal body comprises a material web made of an elastic, gas-tight material and said seal body is connected to a circumference of said first receptacle unit.

6. The device according to claim 3, wherein said seal body extends over a rear portion of said first receptacle unit.

7. The device according to claim 5, wherein said receptacle unit is provided with a handling unit, with an elastic equalization unit being situated interposed.

8. The device according to claim 1, wherein said second receptacle unit is implemented as a contact plate for contact heating using a contact heating unit.

9. The device according to claim 1, wherein said second receptacle unit is implemented as an at least regionally radiation-transparent plate.

10. The device according to claim 1, wherein said second receptacle unit is implemented as a contact heater.

11. The device according to claim 10, wherein said second receptacle unit is implemented as a resistance heater.

12. The device according to claim 11, wherein second receptacle unit is implemented as an electrical resistance film.

13. A device, comprising:
   a first wafer-type component;
   a second wafer-type component;
   a first wafer-type component receiving unit receiving said first wafer-type component, said first wafer-type component receiving unit being mounted for movement such that said first wafer-type component receiving unit is movable between at least a first position and a second position;
   a second wafer-type component receiving unit receiving said second wafer-type component, said first wafer-type component receiving unit being located at a spaced location from said second wafer-type component receiving unit in said first position, said first wafer-type component being in contact with said second wafer-type component in said second position;
   a seal unit connected to said first wafer-type component receiving unit, said seal unit being in contact with said second wafer-type component receiving unit with said first wafer-type component receiving unit in said second position such that said seal unit forms a pressure-tight contact chamber with said first wafer-type component receiving unit and said second wafer-type component receiving unit, said pressure-tight contact chamber surrounding said first wafer-type component and said second wafer-type component, wherein said first wafer-type component and said second wafer-type component are sealed via said sealing unit;
   a vacuum unit;
   an attachment unit, wherein said vacuum unit is connected to said contact chamber via at least a portion of said attachment unit, said vacuum unit generating a vacuum in said contact chamber with said first wafer-type component receiving unit in said second position; and
   an energy impingement unit applying energy to said second wafer-type component via said second wafer-type component receiving unit with said second wafer-type component connected to said first wafer-type component.

14. A device in accordance with claim 13, wherein said seal unit is elastic at least in a connection area between said first wafer-type component receiving unit and said second wafer-type component receiving unit, said seal unit having an elastic seal body, said elastic seal body comprising a seal face formed by a rigid body unit, said rigid body unit comprising a seal ring, said seal ring peripherally surrounding said first wafer-type component receiving unit, said seal ring being connected to said first wafer-type component receiving unit via said seal body, wherein a seal surface of said seal ring presses flatly against said second wafer-type component receiving unit with said first wafer-type receiving component in said second position, said seal body comprising a material web made of an elastic, gas-tight material, said seal body being connected to a circumference of said first wafer-type component receiving unit.

15. A device in accordance with claim 14, further comprising:
   a handling unit; and
   an elastic equalization unit, wherein said first wafer-type component receiving unit is connected to said handling unit and said elastic equalization unit, said elastic equalization unit being located between said first wafer-type component receiving unit and said handling unit.

16. A device in accordance with claim 13, further comprising:
   a handling unit; and
   an elastic equalization unit, wherein said first wafer-type component receiving unit is connected to said handling unit and said elastic equalization unit, said elastic equalization unit being located between said first wafer-type component receiving unit and said handling unit.

17. A device in accordance with claim 13, wherein said seal unit comprises a seal ring and a seal body connected along a circumference of said first wafer-type component receiving unit, said seal ring being connected to said seal body, said seal body comprising an elastic, gas-tight material, said seal ring comprising a sealing surface, said sealing surface being in contact with said second wafer-type component receiving unit with said first wafer-type component receiving unit in said first position.

18. A device, comprising:
a first wafer-type component having a first configuration;
a second wafer-type component having a second configuration;
a first wafer-type component receiving unit in contact with said first wafer-type component, said first wafer-type component receiving unit being mounted for movement such that said first wafer-type component receiving unit is movable between at least a wafer non-contact position, a wafer contact position and a wafer heating position;
a second wafer-type component receiving unit in contact with said second wafer-type component, said first wafer-type component receiving unit being located at a spaced location from said second wafer-type component receiving unit with said first wafer-type component receiving unit in said wafer non-contact position, said first wafer-type component being in contact with said second wafer-type component with said first wafer-type component receiving unit in said wafer contact position;
a seal unit connected to said first wafer-type component receiving unit, said seal unit being in contact with said second wafer-type component receiving unit with said first wafer-type component receiving unit in said wafer contact position such that said seal unit forms a pressure-tight contact chamber with said first wafer-type component receiving unit and said second wafer-type component receiving unit, said pressure-tight contact chamber sealing said first wafer-type component and said second wafer-type component;
a vacuum unit;
an attachment unit, wherein said vacuum unit is connected to said contact chamber via at least a portion of said attachment unit, said vacuum unit generating a vacuum in said contact chamber with said first wafer-type component receiving unit in said wafer contact position; and
an energy impingement unit applying energy to said second wafer-type component via said second wafer-type component with said first wafer-type receiving component in said wafer heating position, said first wafer-type component being in contact with said second wafer-type component with said first wafer-type receiving component in said wafer heating position, said seal unit being in contact with said second wafer-type component receiving unit with said first wafer-type component receiving unit in said wafer heating position.

19. A device in accordance with claim 18, wherein said seal unit is elastic at least in a connection area between said first wafer-type component receiving unit and said second wafer-type component receiving unit, said seal unit having an elastic seal body, said elastic seal body comprising a seal face formed by a rigid body unit, said rigid body unit comprising a seal ring, said seal ring peripherally surrounding said first wafer-type component receiving unit, said seal ring being connected to said first wafer-type component receiving unit via said seal body, wherein a seal surface of said seal ring presses flatly against said second wafer-type component receiving unit with said first wafer-type receiving component in said wafer contact position, said seal body comprising a material web made of an elastic, gas-tight material, said seal body being connected to a circumference of said first wafer-type component receiving unit.

20. A device in accordance with claim 19, further comprising:
a handling unit; and
an elastic equalization unit, wherein said first wafer-type component receiving unit is connected to said handling unit and said elastic equalization unit, said elastic equalization unit being located between said first wafer-type component receiving unit and said handling unit.

* * * * *